United States Patent
Chae et al.

(10) Patent No.: US 7,965,034 B2
(45) Date of Patent: Jun. 21, 2011

(54) ORGANIC ELECTROLUMINESCENCE DISPLAY DEVICE COMPRISING A CONTACT ELECTRODE WITH ELASTICITY AND FABRICATING METHOD THEREOF

(75) Inventors: Gee Sung Chae, Incheon (KR); Jin Wuk Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/417,017

(22) Filed: May 4, 2006

(65) Prior Publication Data

US 2007/0145887 A1    Jun. 28, 2007

(30) Foreign Application Priority Data

Dec. 22, 2005  (KR) .................. 10-2005-0128041

(51) Int. Cl.
H01L 51/50 (2006.01)
H01L 51/00 (2006.01)
H01L 51/52 (2006.01)
H01L 51/54 (2006.01)

(52) U.S. Cl. ........ 313/506; 313/504; 313/512; 313/501; 313/509

(58) Field of Classification Search .......... 313/495–512; 315/169.1, 169.3; 257/40, 72, 98–100, 642–643, 257/759; 427/66, 532–535, 539; 428/690–691, 428/917; 438/26–29, 34, 82
See application file for complete search history.

(56) References Cited

U.S. PATENT DOCUMENTS

| | | | | |
|---|---|---|---|---|
| 6,528,942 B1* | 3/2003 | Tada et al. | ...... | 313/506 |
| 6,831,298 B2* | 12/2004 | Park et al. | ...... | 257/59 |
| 6,870,186 B2* | 3/2005 | Park et al. | ...... | 257/59 |
| 6,909,110 B2* | 6/2005 | Park et al. | ...... | 257/40 |
| 7,187,118 B2* | 3/2007 | Park et al. | ...... | 313/504 |
| 7,436,114 B2* | 10/2008 | Wang et al. | ...... | 313/504 |
| 2003/0035982 A1* | 2/2003 | Ryu et al. | ...... | 429/7 |
| 2003/0201712 A1* | 10/2003 | Park et al. | ...... | 313/504 |
| 2003/0201716 A1* | 10/2003 | Yamazaki et al. | ...... | 313/506 |
| 2004/0000866 A1* | 1/2004 | Seo et al. | ...... | 313/506 |
| 2004/0036410 A1* | 2/2004 | Park et al. | ...... | 313/504 |
| 2004/0080262 A1* | 4/2004 | Park et al. | ...... | 313/498 |
| 2004/0189194 A1* | 9/2004 | Kihara et al. | ...... | 313/506 |

(Continued)

FOREIGN PATENT DOCUMENTS

JP    2003-157029 A    5/2003

(Continued)

OTHER PUBLICATIONS http://web.archive.org/web/20030812025914/http://accudynetest.com/surface_energy_materials.html, Aug. 12, 2003.*

(Continued)

*Primary Examiner* — Nimeshkumar D Patel
*Assistant Examiner* — Jose M Diaz
(74) *Attorney, Agent, or Firm* — Birch, Stewart, Kolasch & Birch LLP

(57) ABSTRACT

An organic electro-luminescence display device includes at least one light emission device, the organic light emission device having a first electrode; at least one thin film transistor for driving the light emission device, a pixel electrode being connected to the at least one thin film transistor; a conductive layer formed of a conductive polymer material to electrically connect the light emission device and the pixel electrode.

4 Claims, 22 Drawing Sheets

U.S. PATENT DOCUMENTS

| | | | |
|---|---|---|---|
| 2004/0195959 A1* | 10/2004 | Park et al. | 313/500 |
| 2005/0139821 A1* | 6/2005 | Park | 257/40 |
| 2005/0140282 A1* | 6/2005 | Park et al. | 313/505 |
| 2005/0236969 A1* | 10/2005 | Seo et al. | 313/500 |
| 2006/0061262 A1* | 3/2006 | Yoo et al. | 313/503 |
| 2006/0202614 A1* | 9/2006 | Li | 313/506 |
| 2007/0298203 A1* | 12/2007 | McDonough et al. | 428/40.1 |

FOREIGN PATENT DOCUMENTS

| | | |
|---|---|---|
| JP | 2004-031317 A | 1/2004 |
| JP | 2004-198990 A | 7/2004 |
| JP | 2004-214593 A | 7/2004 |
| JP | 2004-303522 A | 10/2004 |
| JP | 2005-93335 A | 4/2005 |
| JP | 2005-107294 | 4/2005 |
| JP | 2005-515233 A | 5/2005 |
| JP | 2005-183031 | 7/2005 |
| JP | 2005-196111 A | 7/2005 |
| JP | 2005-196168 A | 7/2005 |
| JP | 2005-197699 A | 7/2005 |
| WO | WO-03/053109 A1 | 6/2003 |

OTHER PUBLICATIONS

Pinto et al., Electrospun polyaniline/polyethylene oxide nanofiber field-effect transistor, Nov. 17, 2003, Applied Physics Letters, vol. 83, No. 20, pp. 4244-4246.*

Machine translation of Okazaki et al JP 2004-303522.*

* cited by examiner

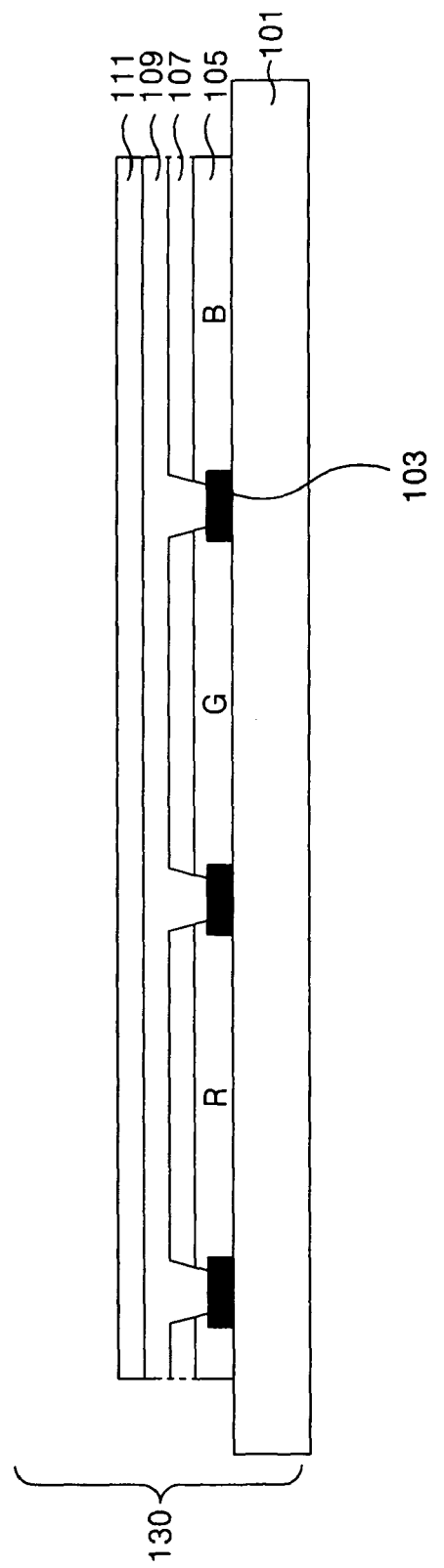

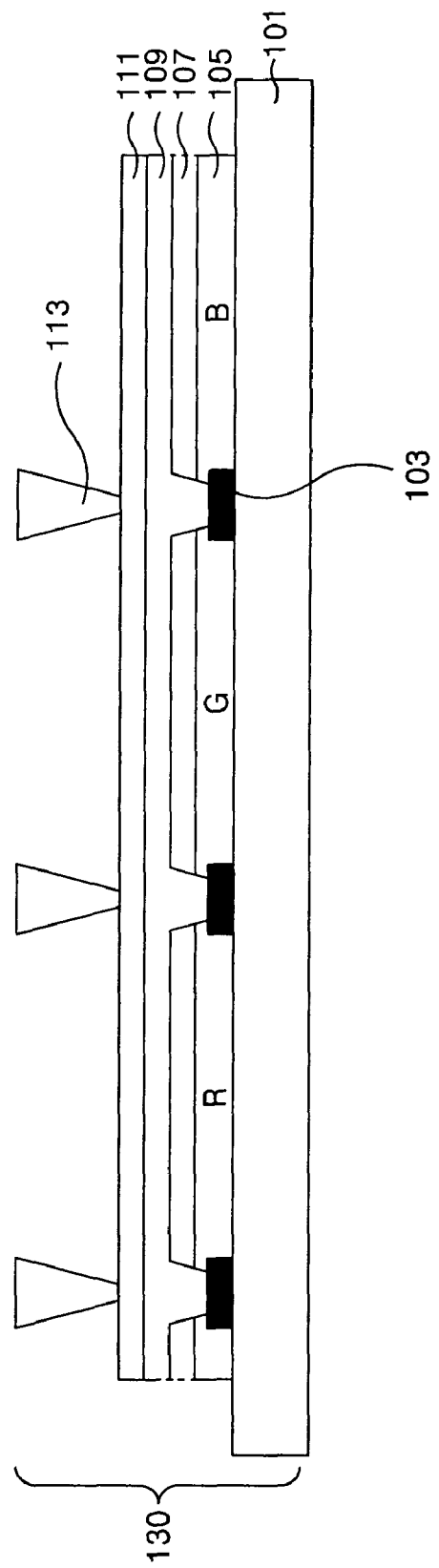

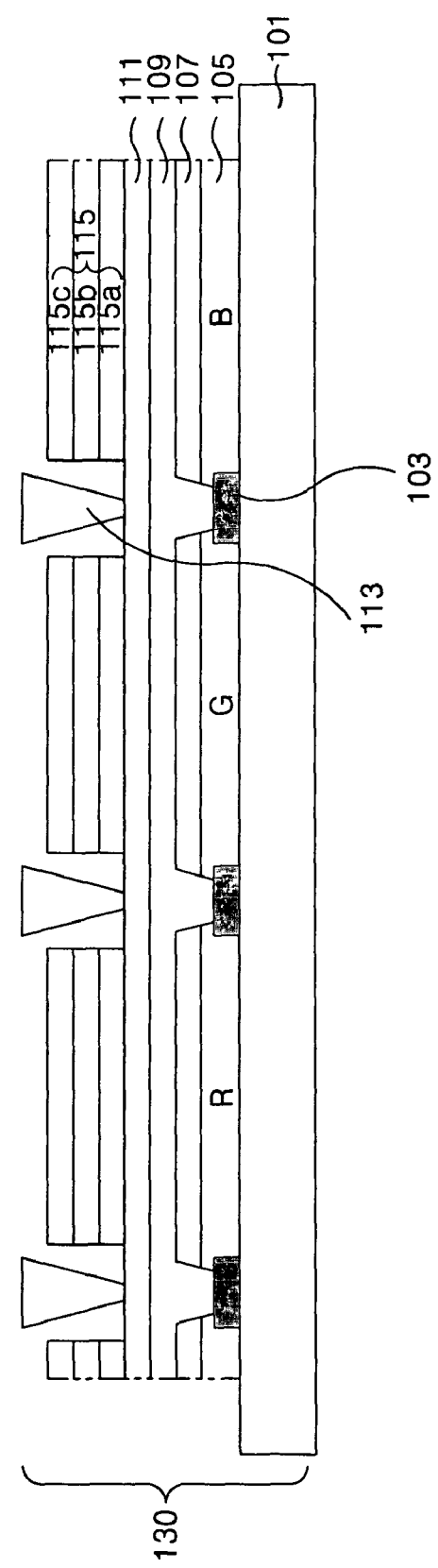

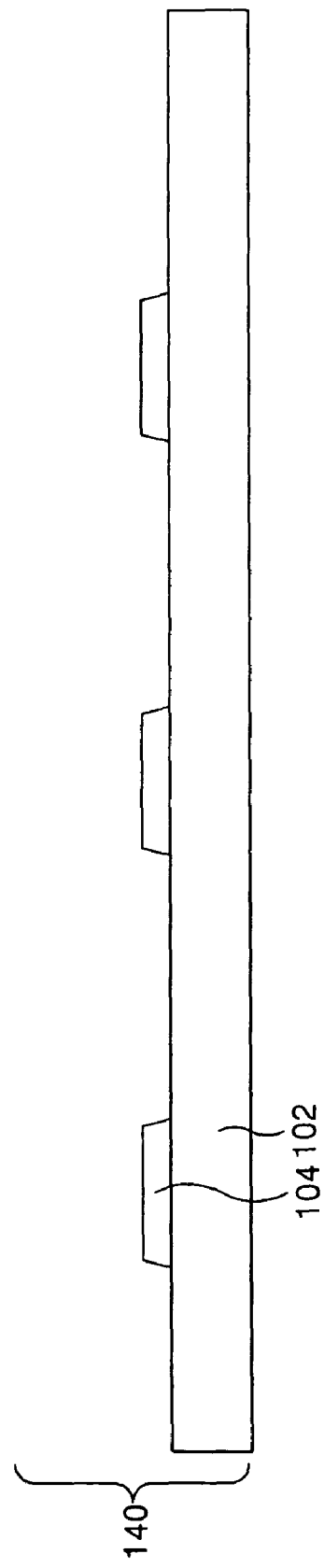

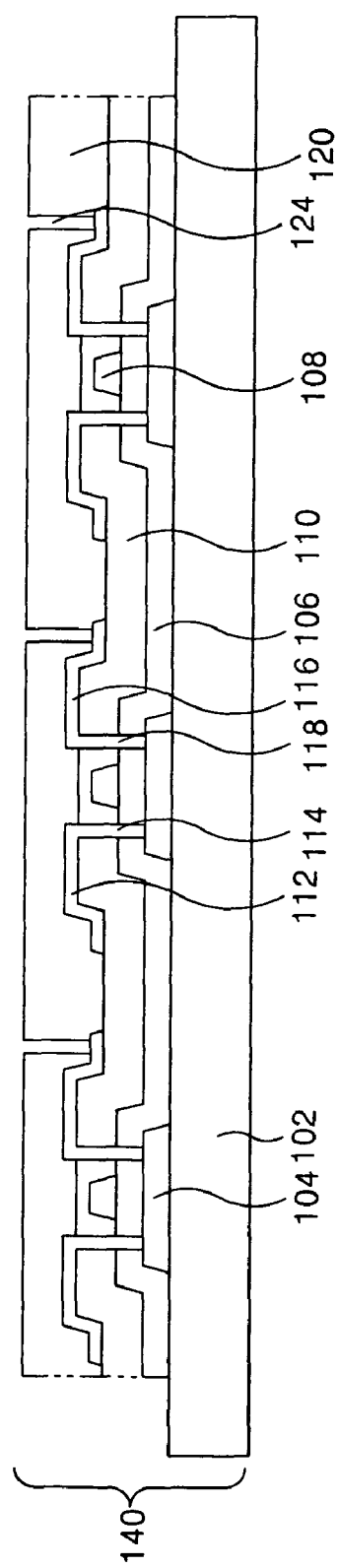

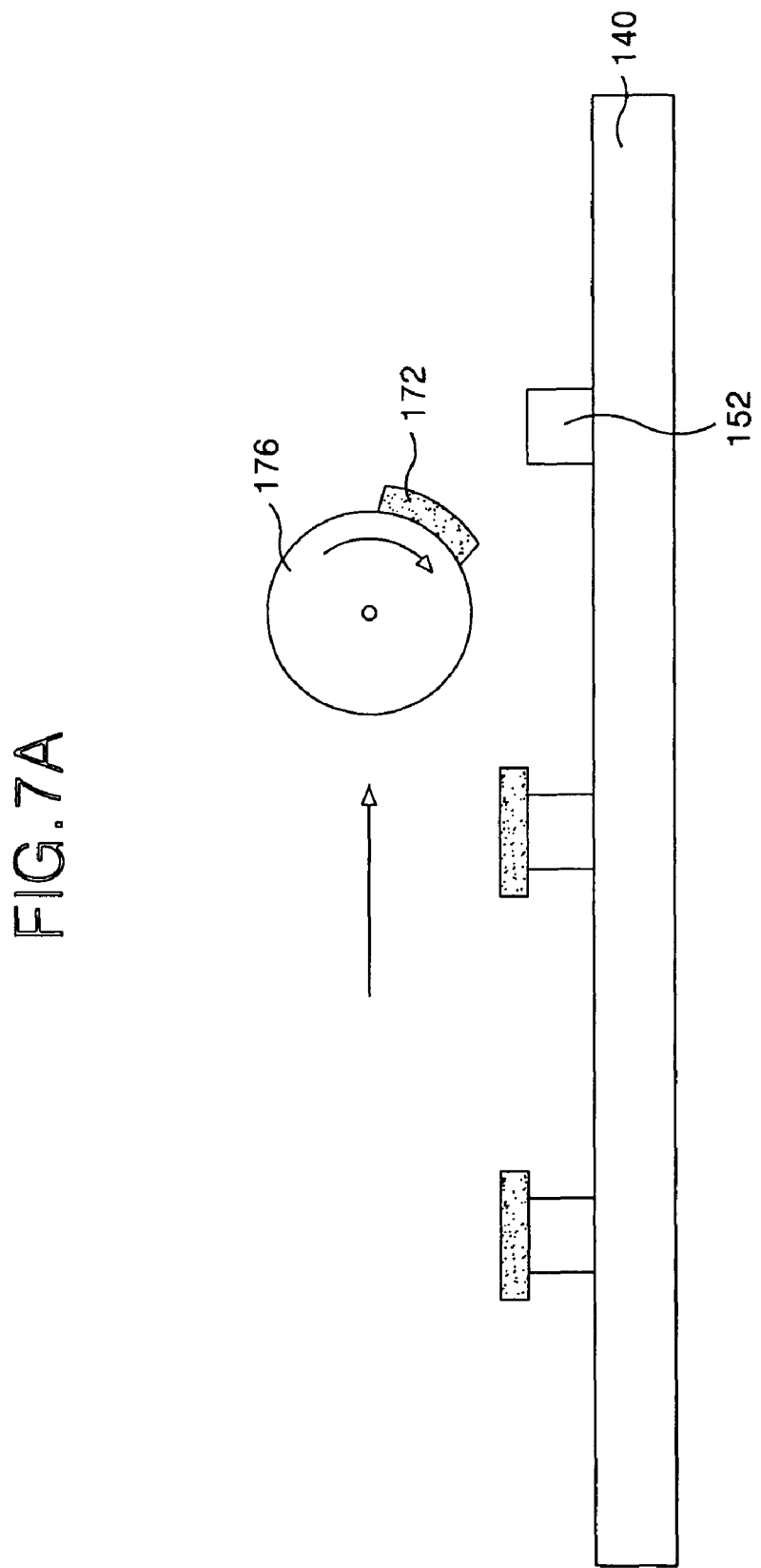

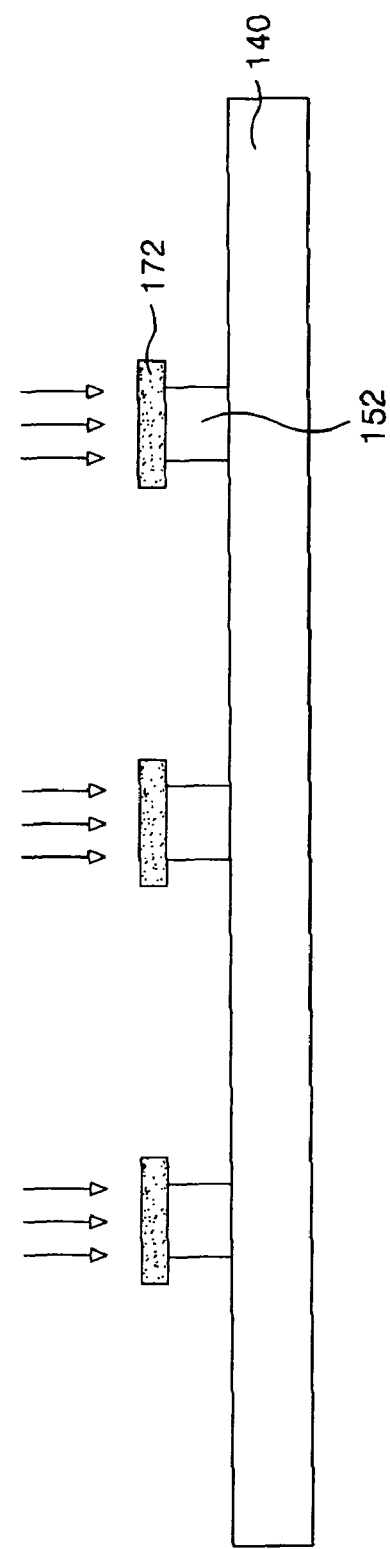

ORGANIC ELECTROLUMINESCENCE DISPLAY DEVICE COMPRISING A CONTACT ELECTRODE WITH ELASTICITY AND FABRICATING METHOD THEREOF

This Nonprovisional Application claims priority under 35 U.S.C. §119(a) on Patent Application No. 10-2005-0128041 filed in Korea on Dec. 22, 2005, the entire contents of which are hereby incorporated by reference.

BACKGROUND OF THE INVENTION

1. Field of the Invention

The present invention relates to an organic electroluminescence display device, and more particularly to an organic electroluminescence display device that is adaptive for solving an electric contacting defect problem caused between a light emission array and a TFT array, and a fabricating method thereof.

2. Description of the Related Art

Recently, various flat panel display devices have been developed to reduce the weight and size so as to replace a relatively heavy and large-size cathode ray tube. The flat panel display device includes liquid crystal display (LCD), field emission display (FED), plasma display panel (PDP), electro-luminescence (EL) display device and so on.

The PDP has a relatively simple structure and fabrication process. Therefore, the PDP is most advantageous to be made large-sized, but it has a disadvantage in that its light emission efficiency and brightness are low and its power consumption is high. The manufacturing process for the LCD is similar to the semiconductor process. Therefore, the LCD is difficult to be made large-sized, and its power consumption is high due to a backlight unit. Further, the LCD has a disadvantage in that its viewing angle is narrow and there is a high light loss by optical devices such as a polarizing filter, a prism sheet, a diffusion plate and so on. In comparison, the EL display device has an advantage in that its response speed is fast, its light emission efficiency and brightness are high and its viewing angle is wide.

The EL display device is generally divided into an inorganic EL display device and an organic EL display device in accordance with the used material.

The organic EL display device is driven with a low voltage of about 5~20[V] in comparison with the inorganic EL display device which requires a high voltage of 100~200[V]. Therefore, it is possible to drive the organic EL display device with a low DC voltage. Further, the organic EL display device can be used as a pixel of a surface light source, a television image display or a graphic display because the organic EL display device has an excellent characteristic such as a wide viewing angle, a high speed response, a high contrast ratio and so on. In addition, the organic EL display has a good color impression and is thin and light. It is a suitable device for the next generation flat panel display.

A method of driving the organic EL display device can be divided into a passive matrix type and an active matrix type.

The passive matrix type organic EL display device is simple in its configuration so its fabricating method is also simple. However, there is a disadvantage in that its power consumption is high, it is difficult to make a display device large-sized, and its aperture ratio is deteriorated as the number of wire lines increases.

On the other hand, the active matrix type organic EL display device has advantages of high light emission efficiency and high picture quality realization.

Further, the organic EL display device can be divided into the Top Emission Type and the Bottom Emission Type in accordance with its light emitting direction.

FIG. 1 is a diagram illustrating an example of the Top Emission Type active matrix organic EL display device in the related art.

Referring to FIG. 1, the Top Emission Type active matrix organic El display device of the related art includes a light emission array 30 comprising a light emitting part formed on a first substrate 1; a TFT array 40 comprising a thin film transistor TFT controlling the light emitting part on a second substrate 2; and a contact part 50 electrically connecting the light emission array 30 and the TFT array 40. Further, the first and second substrates 1, 2 are bonded together by a sealant 60.

The light emission array 30 includes a color filter array, a first electrode 11, an organic light emitting layer 15 and a second electrode 17 which are sequentially deposited on the first substrate 1. Further it includes a barrier rib 13 which separates the organic light emitting layer 15 and the second electrode 17 so as to be form the pixel area.

The color filter array includes a black matrix 3 which prevents light leakage from a pixel and blocks an external light so as to increase contrast ratio; a color filter 5 for realizing color; an auxiliary color layer (or CCM (color change method) layer) 7 for increasing a color reproduction effect of the color filter 5; and an overcoat layer 9 for leveling the color filter array.

The organic light emitting layer 15 includes a hole injecting/transporting layer 15A, a light emitting layer 15B and an electron injecting/transporting layer 15C.

If a voltage is applied between the first electrode 11 and the second electrode 17, a hole generated from the first electrode moves toward the light emitting layer 15B through the hole injecting/transporting layer 15A. Further, an electron generated from the second electrode 17 moves toward the light emitting layer 15B through the electron injecting/transporting layer 15C. Accordingly, the hole and electron collide with each other in the light emitting layer 15B to be re-combined, thereby emitting the light. And, the light is emitted to the outside through the color filter array so that a picture is displayed.

The TFT array 40 includes a semiconductor layer 4, a gate insulating film 6, a gate electrode 8, an interlayer insulating film 10, source and drain electrodes 12, 16, a passivation film 20, and a pixel electrode 22 which are sequentially deposited on the second substrate 2.

As having the injected n+ impurities, the semiconductor layer 4 includes a source area, a drain area and a channel area formed between the source area and the drain area. The semiconductor layer 4 properly further includes an LDD (lightly doped drain) area, where n-impurities are injected, between the channel area and the source and drain areas for reducing an off-current.

The gate electrode 8 is formed to overlap the channel area of the semiconductor layer 4 with the gate insulating film 6. The source and drain electrodes 12, 16 are formed to be insulated with the gate electrode 8 by the interlayer insulating film 10 therebetween. The source and drain electrodes 12, 16 are respectively connected to the source and drain areas of the semiconductor layer 4 through a source contact hole 14 and a drain contact hole 18 which penetrate the gate insulating film 6 and the interlayer insulating film 10.

The pixel electrode 22 is connected to the drain electrode 16 through the pixel contact hole 24 which penetrates the passivation film 20.

The light emission array 30 and the TFT array 40 are electrically contacted with each other through a contact part 50. The contact part 50 includes a contact supporting part 52 and a contact electrode 54. The contact supporting part 52 is formed of a photo-resist pattern. The contact electrode 54 is formed by a mask process to cover the pixel electrode 22 and the contact supporting part 52, and is contacted with the second electrode 17 of the light emission array 30 when bonding the first and second substrates 1, 2, thereby electrically connecting the light emission array 30 and the TFT array 40.

The contact electrode 54 is comprised of a metal material such as aluminum (Al), molybdenum (Mo), chrome (Cr) and so on. In addition, the second electrode 17 of the emission array 30 is also comprised of the metal material. Therefore, the contacting adhesion between the contact electrode 54 and the second electrode 17 is weak. Therefore, it may cause an electric contacting problem that a signal from the TFT array 40 is not properly supplied to the second electrode 17. Further, in case that the photo-resist pattern is not formed in a uniform thickness when forming the contact supporting part 52, the contacting defect problem might be generated because the contact electrode 54 formed on the contact supporting part 52 is thin and may not be in contact with the second electrode 17 of the light emission array 30. Because the contact supporting part 52, the contact electrode 54 and the second electrode 17 are all rigid material such as metal, when joining the contact electrode 54 and the second electrode 17, it is hard to completely contact the second electrodes 17 with the contact electrodes 54 over the entire substrate area. Because it is hard to form the all contact supporting part 52 and the contact electrode 54 to have the exactly same height, a gap may be generated between some contact electrodes 54 and the corresponding second electrodes 17, which causes the contact defect.

SUMMARY OF THE INVENTION

Accordingly, it is one of the objects of the present invention to provide an organic electroluminescence display device that is adaptive for solving a contacting defect problem caused between a light emission array and a TFT array, and a fabricating method thereof.

It is another one of the objects of the present invention to provide an organic electroluminescence display device that has a contact electrode with elasticity so as to be completely contacted with the electrode of the light emission array by pressing.

In order to achieve these and other objects of the invention, an organic electro-luminescence display device as embodied in the present invention includes a light emission array having a color filter array and an organic light emitting layer on a first substrate; a thin film transistor array on a second substrate for controlling the light emission array; and a contact electrode formed of a conductive polymer material to electrically connect the light emission array and the thin film transistor array.

In another aspect of the present invention, a method of fabricating an organic electroluminescence display device, as embodied in the present invention, includes providing first and second substrates; forming a light emission array including a color filter array and an organic light emitting layer on the first substrate; forming a thin film transistor array on the second substrate for controlling the light emission array; and forming a contact electrode which includes a conductive polymer material for electrically connecting the light emission array and the thin film transistor array.

In another aspect of the present invention, an organic electro-luminescence display device, as embodied in the present invention, includes at least one light emission device, the light emission device having a first electrode; at least one thin film transistor for driving the light emission device, the at least one thin film transistor being connected to a pixel electrode; a conductive layer formed of a conductive polymer material to electrically connect the light emission device and the pixel electrode.

In another aspect of the present invention, a method of fabricating an organic electroluminescence display device, as embodied in the present invention, includes forming at least one light emission device having a first electrode; forming at least one thin film transistor for driving the light emission device; forming a pixel electrode connected to the at least one thin film transistor; forming a conductive layer formed of a conductive polymer material to electrically connect the light emission device and the pixel electrode.

BRIEF DESCRIPTION OF THE DRAWINGS

These and other objects of the invention will be apparent from the following detailed description of the embodiments of the present invention with reference to the accompanying drawings, in which:

FIGS. 3A to 3F are diagrams illustrating a fabrication process of a light emission array shown in FIG. 2;

FIGS. 4A to 4G are diagrams illustrating a fabrication process of a TFT array shown in FIG. 2;

FIGS. 7A to 7C are diagrams illustrating a second embodiment of forming a contact electrode shown in FIG. 2.

DETAILED DESCRIPTION OF THE ILLUSTRATED EMBODIMENTS

Reference will now be made in detail to the preferred embodiments of the present invention, examples of which are illustrated in the accompanying drawings.

With reference to FIGS. 2 to 7C, embodiments of the present invention will be explained as follows.

Figure 1:
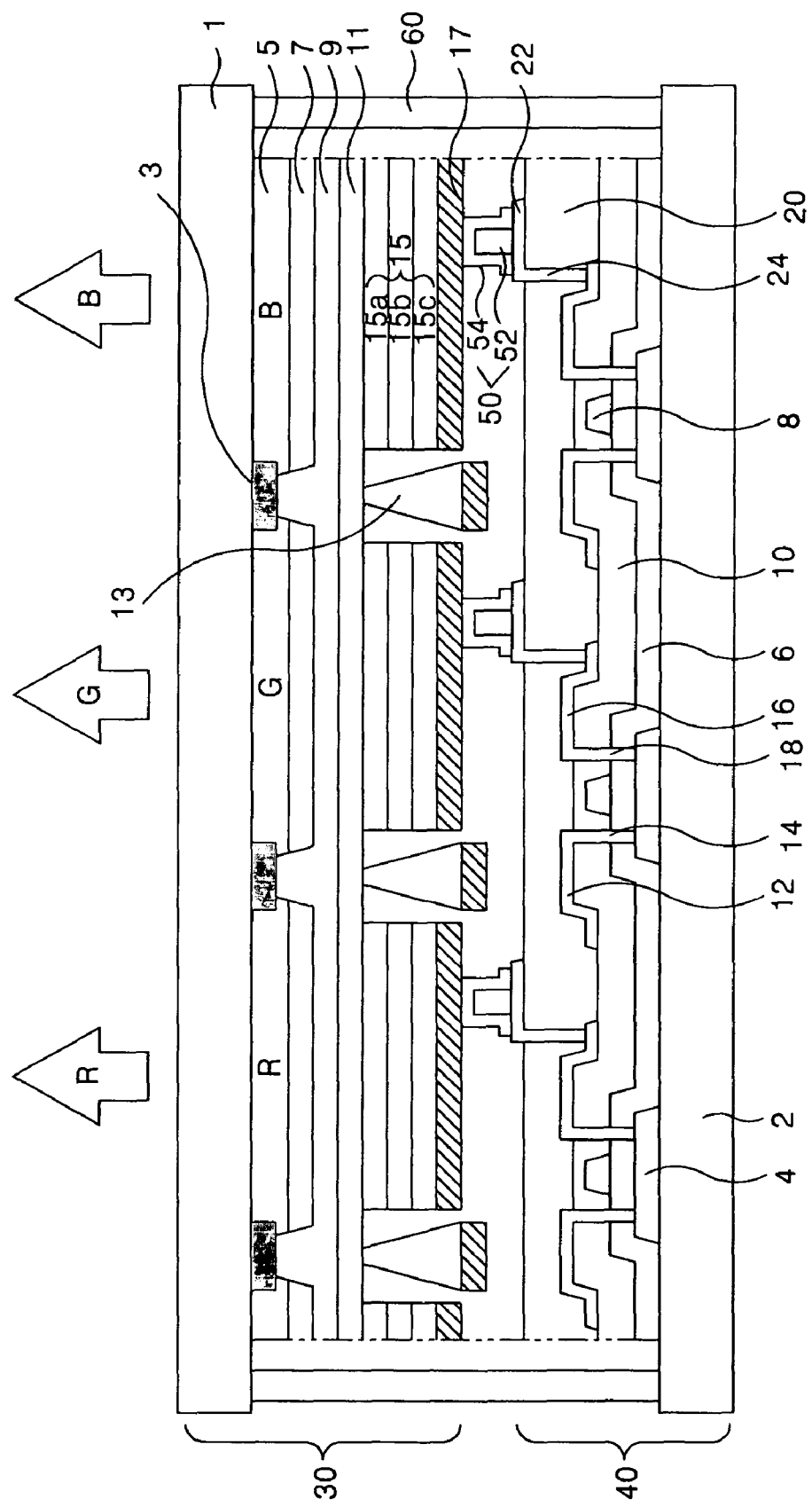
FIG. 1 is a diagram illustrating a Top Emission Type active matrix organic electroluminescence display device of the related art.
Figure 2:
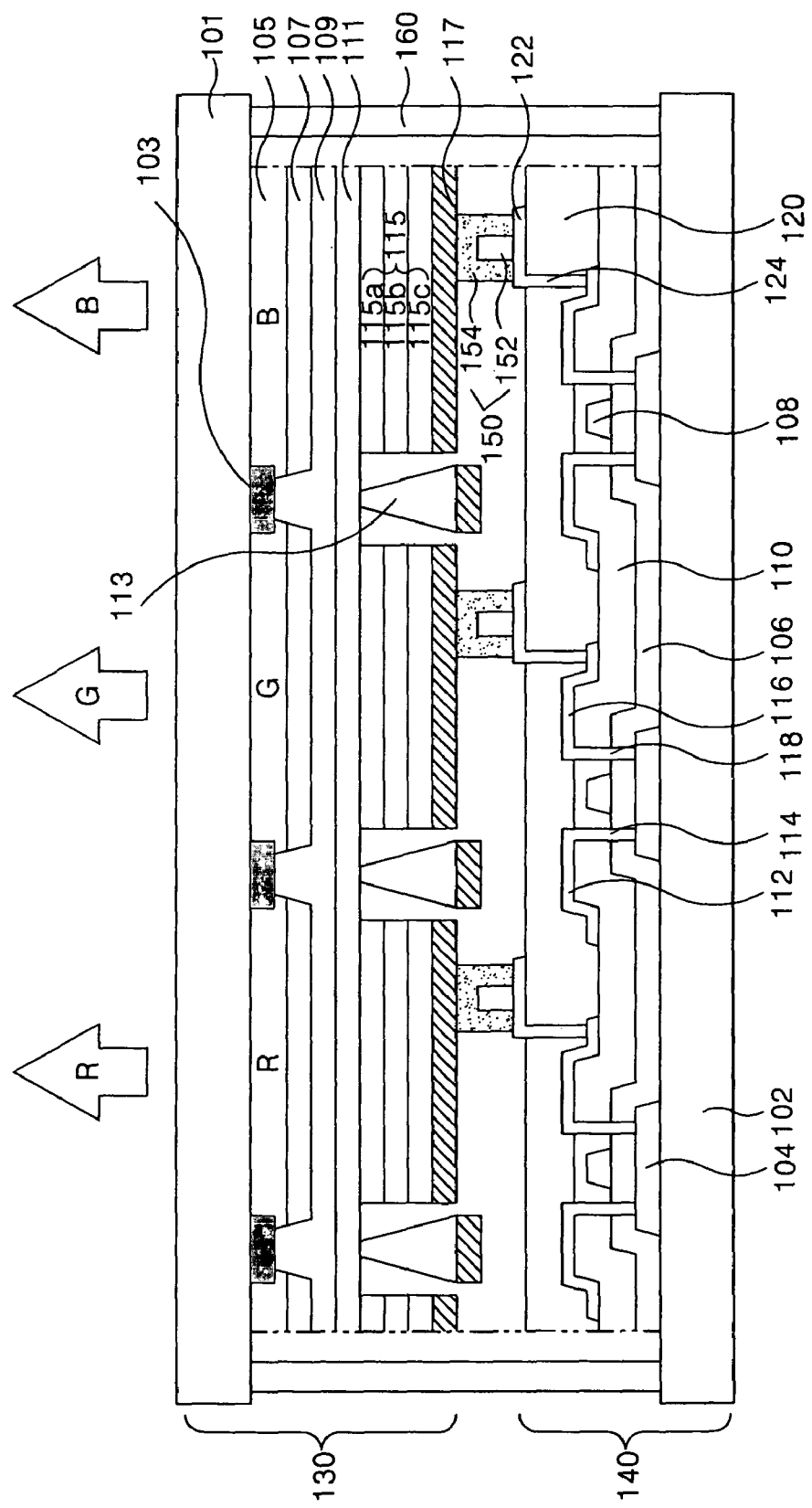
FIG. 2 is a diagram illustrating a Top Emission Type active matrix organic electroluminescence display device according to an embodiment of the present invention.

FIG. 2 is a diagram illustrating a Top Emission Type active matrix organic electroluminescence display device according to an embodiment of the present invention.

Referring to FIG. 2, the organic electroluminescence display device according to an embodiment of the present invention includes a light emission array 130 where a light emitting part is formed on a first substrate 101; a TFT array 140 where a thin film transistor TFT controlling the light emitting part is formed on a second substrate 102; and a contact part 150 which electrically connects the light emission array 130 and the TFT array 140. The first and second substrates 101, 102 are bonded together by a sealant 160.

The light emission array 130 includes a color filter array, a first electrode 111, an organic light emitting layer 115 and a second electrode 117 which are sequentially deposited in the first substrate 101, and further includes a barrier rib 113 which separates the organic light emitting layer 115 and the second electrode 117 so as to form a pixel area.

The color filter array includes a black matrix 103 which prevents light leakage from a pixel and blocks/absorbs an external light so as to increase contrast ratio; a color filter 105 for realizing color; an auxiliary color layer (or CCM (color change method) layer) 107 for increasing a color reproduction effect of the color filter 105; and an overcoat layer 109 for leveling the color filter array.

The organic light emitting layer 115 includes a hole injecting/transporting layer 115A, a light emitting layer 115B and an electron injecting/transporting layer 115C.

If a voltage is applied between the first electrode 111 and the second electrode 117, a hole generated from the first electrode 111 moves toward the light emitting layer 115B through the hole injecting/transporting layer 115A. Further, an electron generated from the second electrode 117 moves toward the light emitting layer 115B through the electron injecting/transporting layer 115C. Accordingly, the hole and electron collide with each other in the light emitting layer 115B to be re-combined, thereby emitting the light. The light is emitted to the outside through the color filter array to display a picture.

The TFT array 140 includes a semiconductor layer 104, a gate insulating film 106, a gate electrode 108, an interlayer insulating film 110, source and drain electrodes 112, 116, a passivation film 120, and a pixel electrode 122 which are sequentially deposited in the second substrate 102.

By injecting the n+ impurities, the semiconductor layer 104 includes a source area, a drain area and a channel area formed between the source area and the drain area. And, the semiconductor layer 104 might further include an LDD (lightly doped drain) area, where n-impurities are injected, between the channel area and the source and drain areas for reducing an off-current.

The gate electrode 108 is formed to overlap the channel area of the semiconductor layer 104 with the gate insulating film 106. The source and drain electrodes 112, 116 are formed to be insulated with the gate electrode 108 with the interlayer insulating film 110 therebetween. The source and drain electrodes 112, 116 are respectively connected to the source and drain areas of the semiconductor layer 104 through a source contact hole 114 and a drain contact hole 118 which penetrate the gate insulating film 106 and the interlayer insulating film 110.

The pixel electrode 122 is connected to the drain electrode 116 through the pixel contact hole 124 which penetrates the passivation film 120.

The light emission array 130 and the TFT array 140 are electrically contacted with each other through a contact part 150. The contact part 150 includes a contact supporting part 152 and a contact electrode 154. The contact supporting part 152 is formed by a photolithography process using a photoresist pattern of metal material. The contact electrode 154 is formed to cover the contact supporting part 152 and part of the pixel electrode 122 by use of a material such as polyaniline, polypyrole, polythiopene and so on. Further, the contact electrode 154 is in contact with the second electrode 117 of the light emission array 130 when bonding the first and second substrates 101, 102, thereby electrically connecting the light emission array 130 and the TFT array 140.

The fabricating method of the organic electroluminescence display device according to an embodiment of the present invention including a method of forming the contact electrode 154 will be explained in reference to FIGS. 3A to 3F. FIGS. 3A to 3F are diagrams shown by inverting an upper part and a lower part of the light emission array 130 shown in FIG. 2 in order to explain the fabrication process of the light emission array 130 shown in FIG. 2.

Referring to FIG. 3, an opaque material is patterned by a photolithography process using a mask and an etching process after the opaque material is deposited in the first substrate 101, thereby forming the black matrix 103.

A photosensitive red resin R is deposited on the entire surface of the first substrate 101 where the black matrix 103 is formed. A mask having an exposure area and a shielding area is aligned on the first substrate 101 where the red resin R is deposited. Subsequently, the red resin R exposed through an exposure area by a photolithography process using a mask and an etching process is removed and the red resin R which is not exposed through a shielding area remains, thereby forming a red color filter 105R.

A green resin G is deposited on the entire surface of the first substrate 101 where the red color filter 105R is formed. The same mask process as the process of forming the red color filter 105R is repeated, thereby forming a green color filter 105G.

A blue resin B is deposited on the entire surface of the first substrate 101 where the green color filter 105G is formed. The same mask process as the process of forming the red and green color filters 105R, 105G is repeated, thereby forming a blue color filter 105B. At this moment, gaps between the adjacent blue, green and red color filters 105B, 105R, 105G are each set to be about 5 μm to 7 μm with the black matrix 103 therebetween.

An auxiliary color layer 107 is formed on the color filter 105 which is formed through such a process. The auxiliary color layer 107 is formed to correspond to the color filter 105, thereby acting to increase a color reproduction of the color filter 105.

Figure 3A:
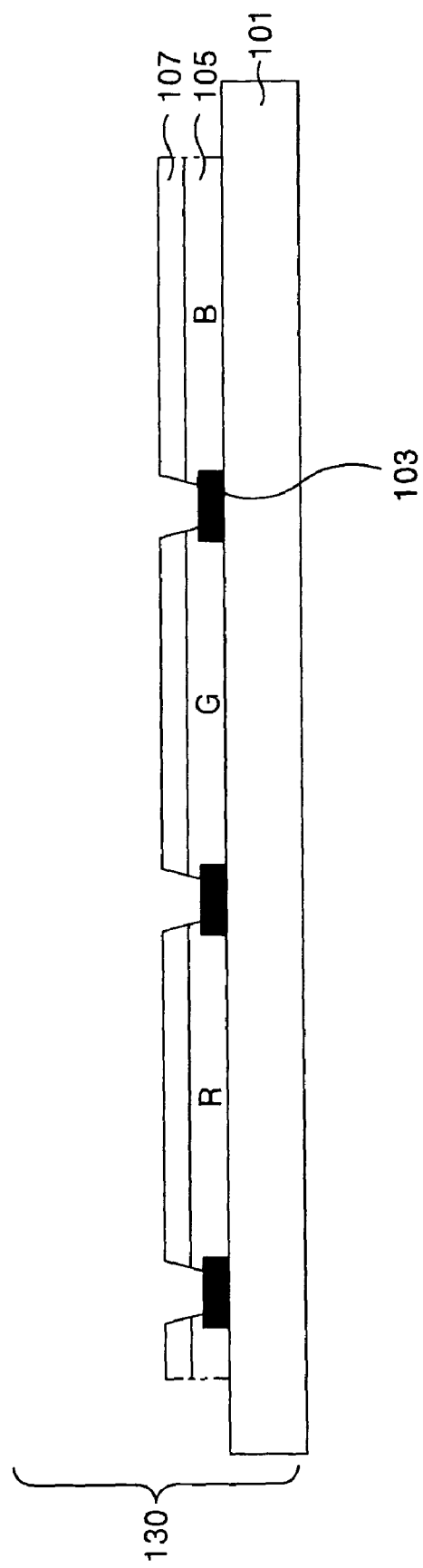
Figure 3B:
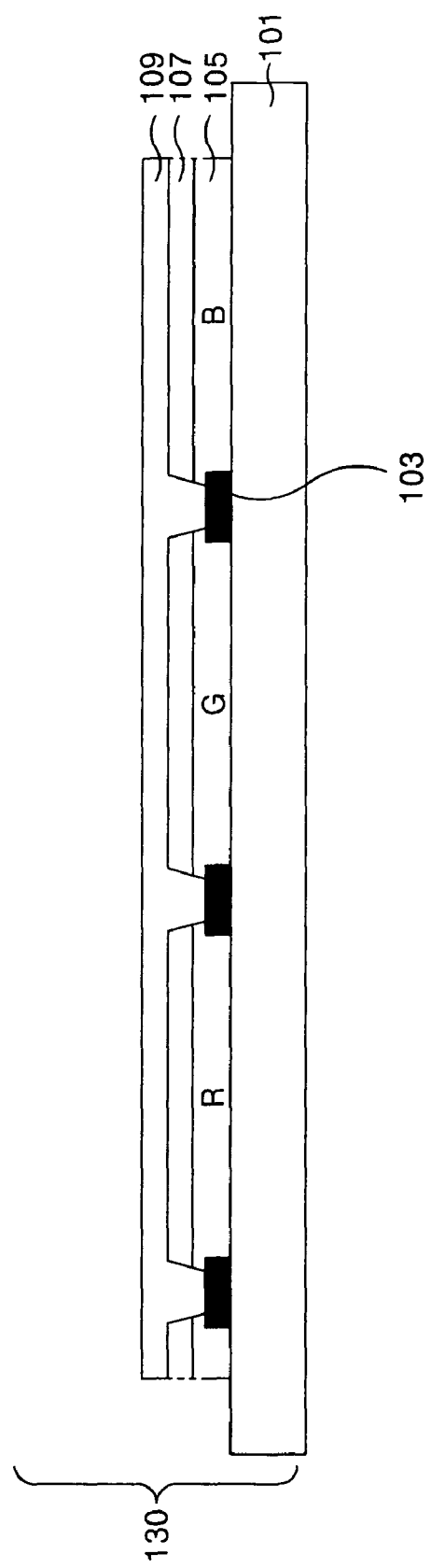

A transparent resin with an insulating characteristic is spread on the first substrate 101 where the auxiliary color layer 107 is formed, thereby forming an overcoat layer 109, as shown in FIG. 3B.

The transparent electrode material is deposited on the entire surface of the first substrate 101 where the overcoat layer 19 is formed, by a deposition method such as sputtering, etc, thereby forming the first electrode 111, as shown in FIG. 3C. The transparent electrode material in use is indium tin oxide (ITO), tin oxide (TO) or indium zinc oxide (IZO).

An insulating material is patterned by a photolithography process and an etching process after depositing or spreading an organic or inorganic insulating material on the first substrate 101 where the first electrode 111 is formed, thereby forming a barrier rib 113, as shown in FIG. 3D. The barrier rib 113 has a reverse taper structure so that the organic light emitting layer formed later on can be separated. Even though not shown in the diagram, an insulating film can further be formed between the first electrode 111 and the barrier rib 113.

Subsequently, as shown in FIG. 3E, the organic light emitting layer 115 corresponding to each color filter 105 area is formed on the first substrate 101 where the barrier rib 113 is formed. At this moment, the organic light emitting layer 115 can be configured to be single-layered or multi-layered. In case of being configured to be multi-layered, the hole injecting/transporting layer 115A, the light emitting layer 115B, and the electron injecting/transporting layer 115C are sequentially formed.

Figure 3F:
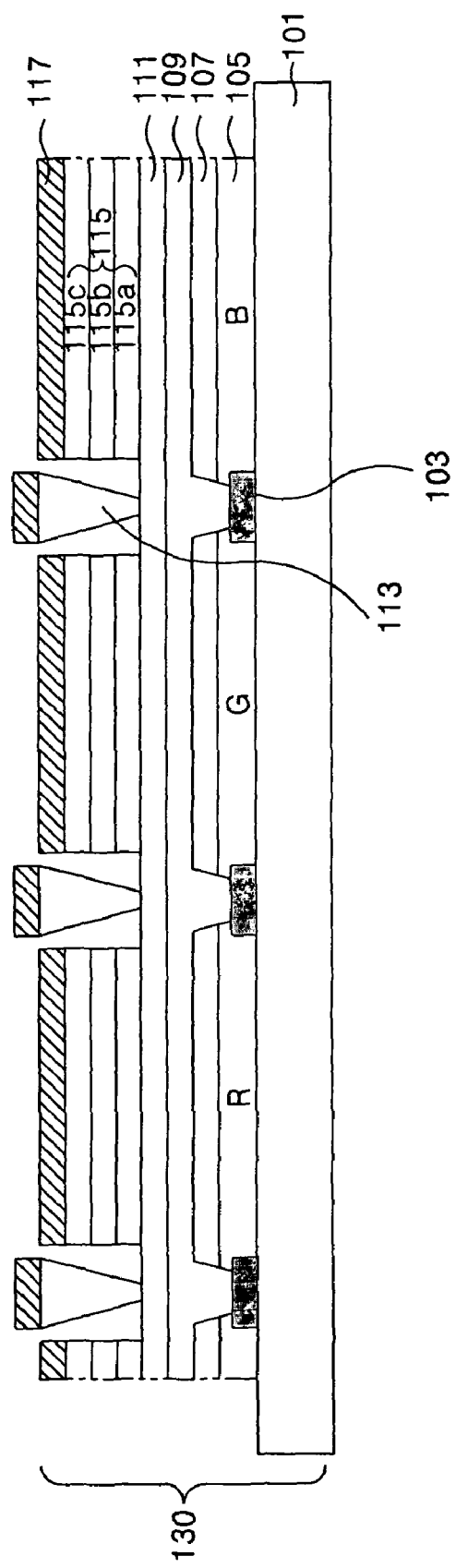

A second electrode 117 is formed by a deposition method such as sputtering on the first substrate 101 where the organic light emitting layer 115 is formed, as shown in FIG. 3F. The second electrode 117 can be formed by use of one of aluminum (Al), calcium (Ca) and magnesium (Mg). It can also be formed in a double metal layer of lithium fluorine/aluminum (LIF/Al) or as the like.

FIGS. 4A to 4G are diagrams illustrating a fabrication process of a TFT array 140 shown in FIG. 2.

First, referring to FIG. 4A, a poly crystalline silicon layer is formed by a dehydrogenation process and a crystallization process using heat after depositing an amorphous silicon on the second substrate 102, and the silicon layer is patterned by a photolithography process using a mask and an etching process, thereby forming the semiconductor layer 104.

The semiconductor layer 104 is defined as a source area, a drain area and a channel area formed between the source area and the drain area.

A buffer layer including at least one of silicon nitride and silicon oxide (though not shown in the diagram) might be formed between the second substrate 102 and the semiconductor layer 104.

Figure 4B:
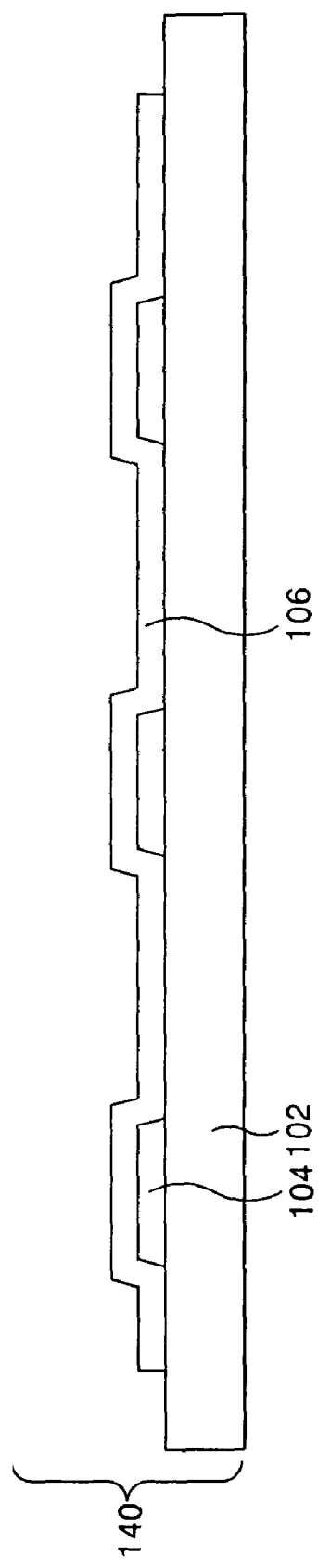

The gate insulating film 106 is formed by use of an insulating material such as silicon nitride and silicon oxide, as shown in FIG. 4B, on the second substrate 102 where the semiconductor layer 104 is formed.

Figure 4C:
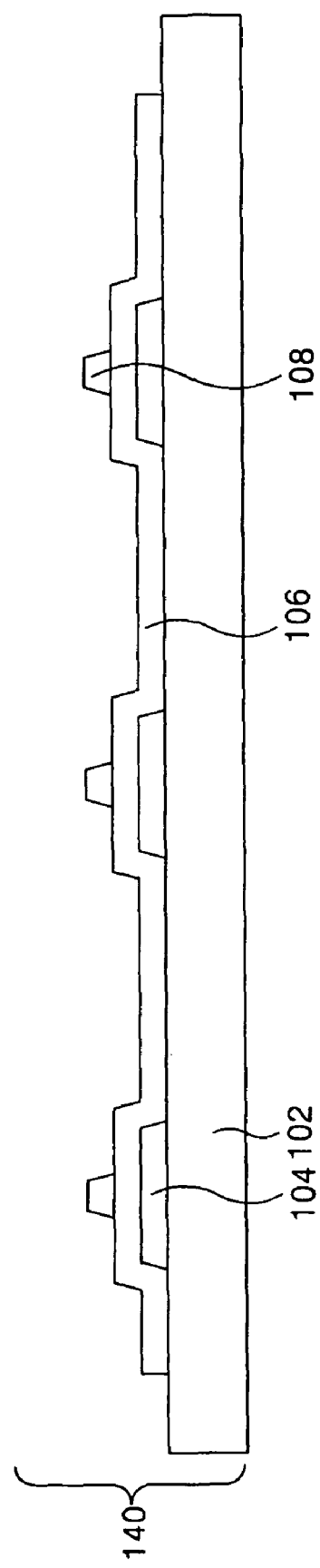

A gate metal material is patterned by a photolithography process using a mask and an etching process after depositing a gate metal material by a deposition method such as sputtering on the second substrate 102 where the gate insulating film 106 is formed, thereby forming the gate electrode 108, as shown in FIG. 4C. And then, impurities are injected to form a source area and a drain area of the semiconductor layer 104. The gate metal material is a conductive metal including at least one of aluminum (Al), aluminum alloy, copper (Cu), tungsten (W), tantalum (Ta) and molybdenum (Mo).

Figure 4D:
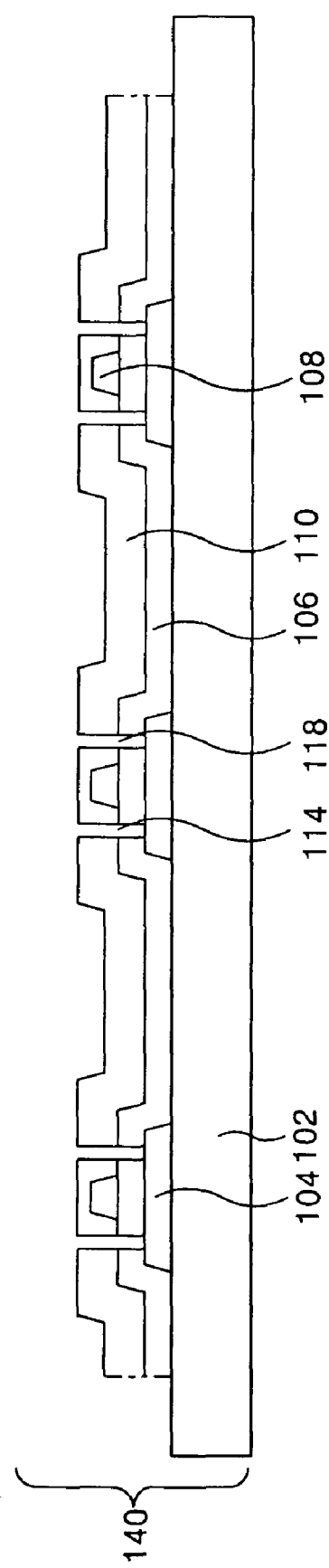

An insulating material is formed by a photolithography process using a mask and an etching process after depositing the insulating material on the second substrate 102 where the gate electrode 108 is formed. The interlayer insulating film 110 including the source and drain contact holes 114, 118 which expose the source and drain areas of the semiconductor layer 104, is formed as shown in FIG. 4D.

Figure 4E:
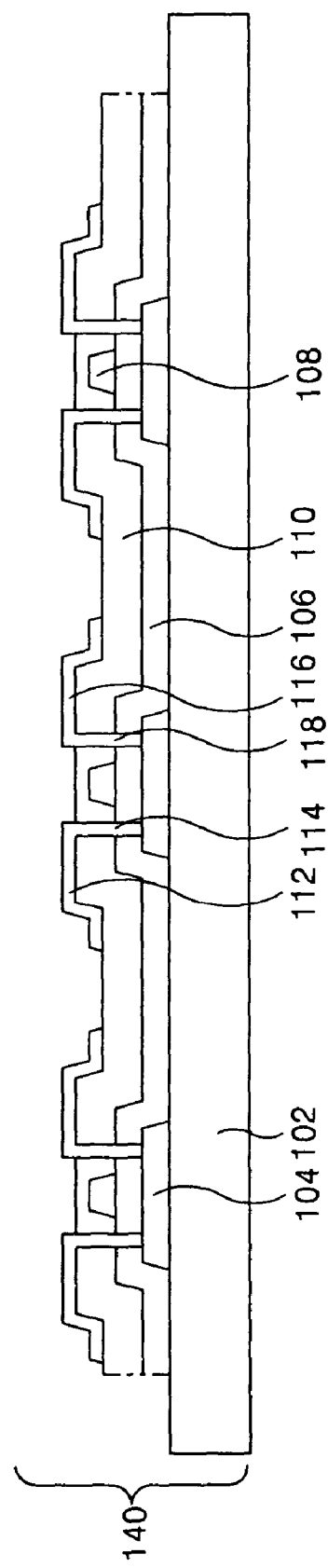

Subsequently, a source and drain metal layer is patterned by a photolithography process using a mask and an etching process after depositing the source and drain metal layer by the deposition method such as sputtering on the second substrate 102 where the interlayer insulating film 110 is formed. The source electrode 112 and the drain electrode 116 which are respectively in contact with the source area and drain area of the semiconductor layer 104, are formed as shown in FIG. 4E. At this moment, the source electrode 112 and the drain electrode 116 are each in contact with the semiconductor layer 104 through the source contact hole 114 and the drain contact hole 118.

The insulating material is patterned by a photolithography process and an etching process after depositing the insulating material on the second substrate 102 where the source and the drain electrodes 112, 116 are formed. The passivation film 120 having the pixel contact hole 124 which exposes the drain electrode 116, is formed as shown in FIG. 4F.

Figure 4G:
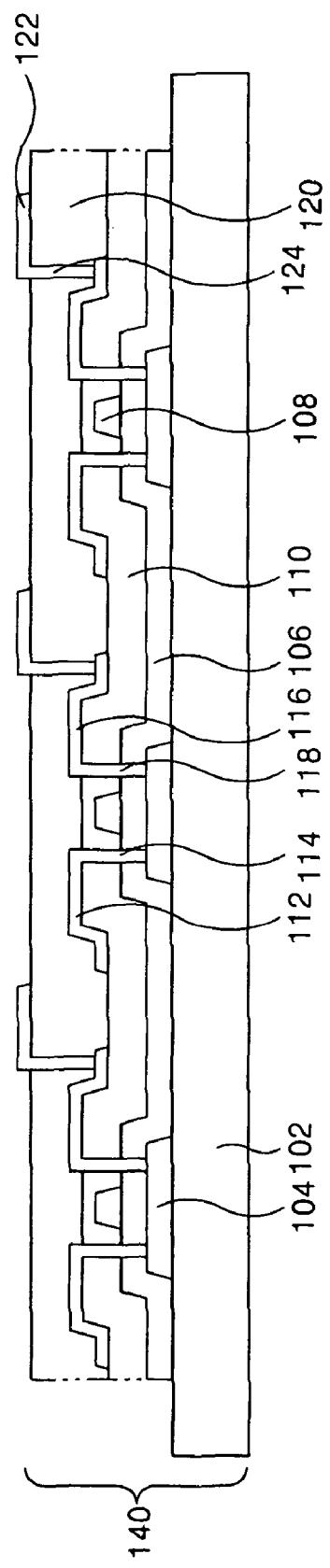

The conductive metal is patterned by a photolithography process and an etching process after depositing the conductive metal on the second substrate 102 where the passivation film 120 is formed. The pixel electrode 122 which is in contact with the drain electrode 116, is formed as shown in FIG. 4G. At this moment, the pixel electrode 122 is in contact with the drain electrode 116 through the pixel contact hole 124.

Figure 5:
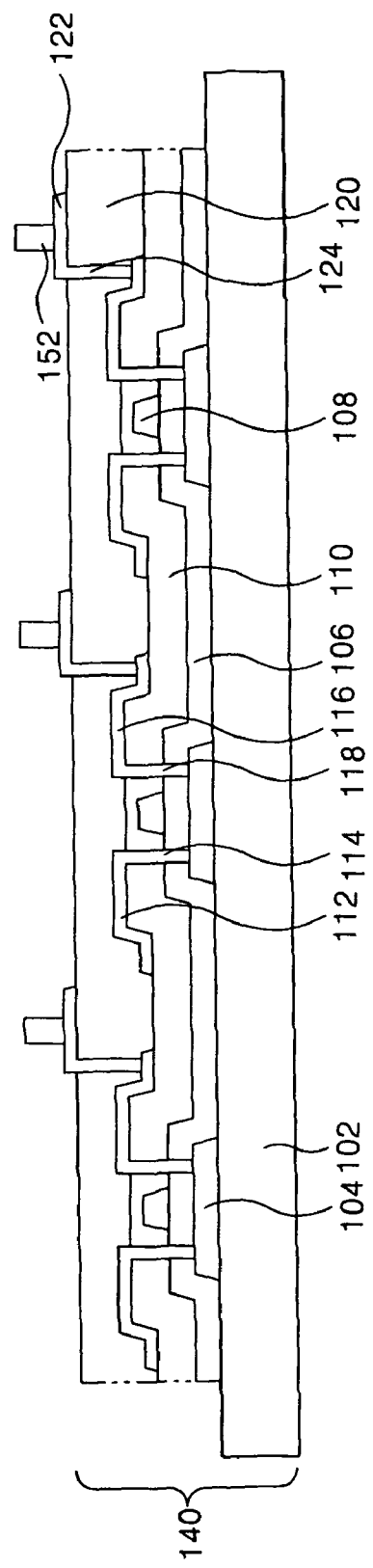
FIG. 5 is a diagram illustrating the formation of a contact supporting part shown in FIG. 2.

The photo-resist pattern is formed on the pixel electrode 122 of the TFT array 140 formed by such a process, thereby forming the contact supporting part 152, as shown in FIG. 5.

Figure 6A:
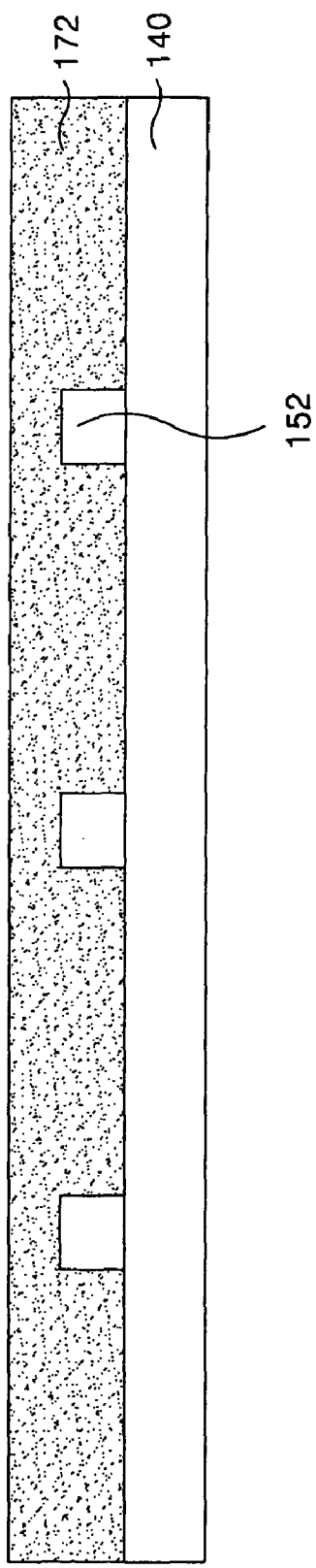
FIGS. 6A to 6C are diagrams illustrating a first embodiment of forming a contact electrode shown in FIG. 2.
Figure 6B:
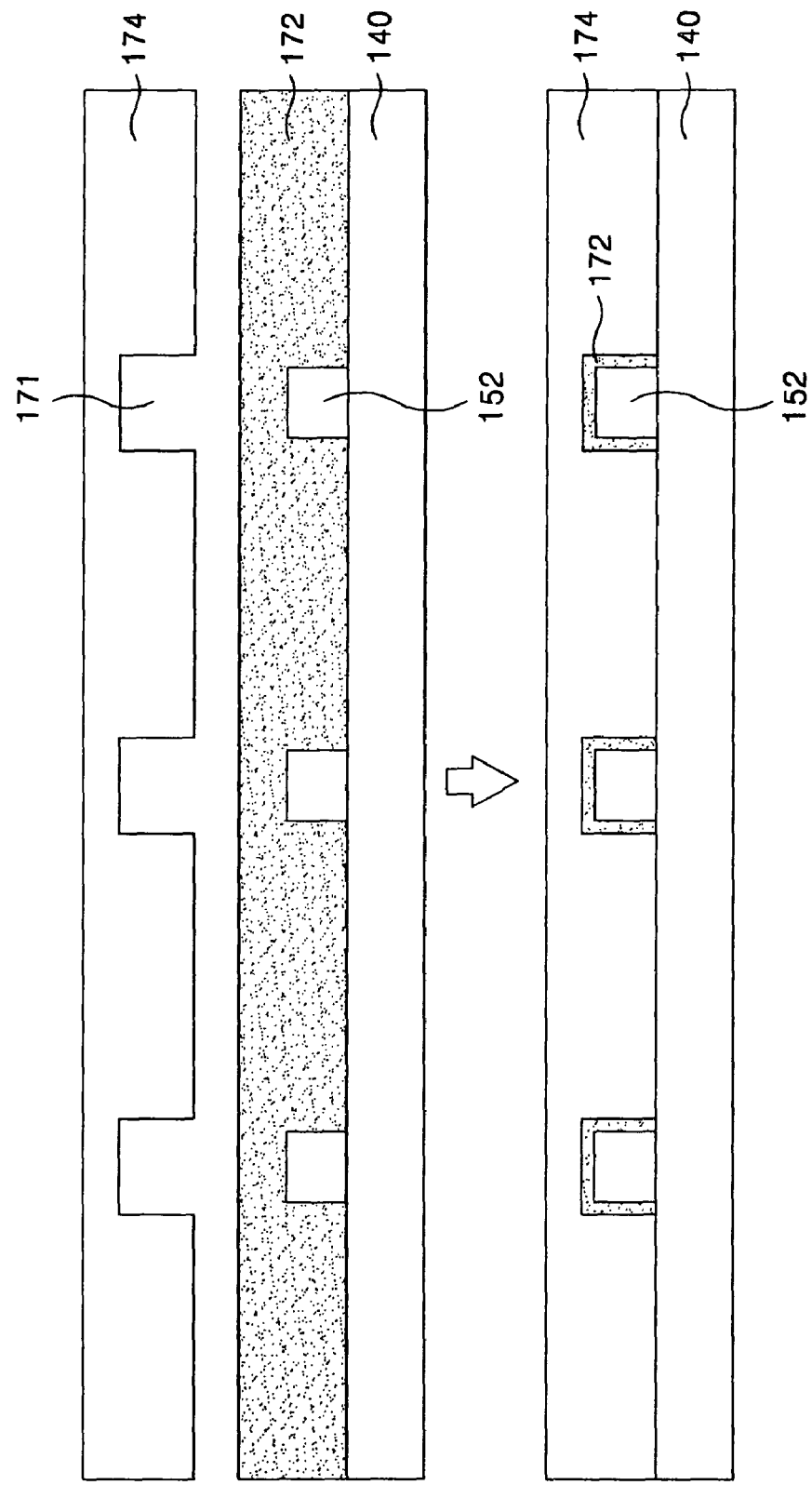
Figure 6C:
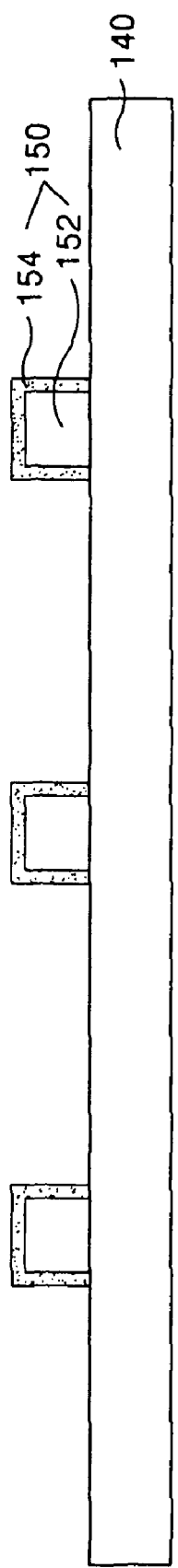

FIGS. 6A to 6C are diagrams illustrating a first embodiment of forming a contact electrode 154 on the contact supporting part 152.

At first, referring to FIG. 6A, a conductive polymer 172 is sprayed by a spreading process such as nozzle spray, spin coating or the like on the TFT array 140 where the contact supporting part 152 is formed. The conductive polymer 172 comprises of at least selected one of polyaniline, polypyrole, polythiopene and so on. In this embodiment, there is used a molding technique of solidifying to form a shape with a soft mold 174. The conductive polymer material can be used by being mixed with a polymer material which can be hardened by heat, UV or a mono-acryl.

After aligning the soft mold 174 on the spread conductive polymer 172, as shown in FIG. 6B, the soft mold 174 is pressed slightly. For example, the soft mold 174 can be pressed by its own weight. Then, the soft mold 174 can exactly contact to the top surface of the TFT array 140.

The soft mold 174 is made from a rubber material with high elasticity such as polydimethylsiloxane (PDMS), polyurethane or cross-linked Novolac resin. There is a groove 171 corresponding to a pattern which makes the conductive polymer 172 remain on the TFT array 140, i.e., a pattern which electrically connects the pixel electrode 122 of the TFT array 140 with the second electrode 117 of the light emission area 30. Herein, the typical soft mold 174 is proposed in the Korean Patent Application No. 2003-0098122 which is pre-applied by this applicant of the present invention. The soft mold is surface-treated to have the hydrophobic or the hydrophilic property. In an embodiment of the present invention, the soft mold is treated to have a repulsive property against the conductive polymer 172.

The conductive polymer 172 is gathered into a space formed between the contact supporting part 152 and the groove 171 of the soft mold 174 by a capillary force generated by a pressure between the soft mold 174 and the TFT array 140 and a repulsive force between the soft mold 174 and the conductive polymer 172, as shown in FIG. 6B. As a result, the conductive polymer 172 pattern is formed on the TFT array 140 in a pattern shape of being transferred inversely to the groove 171 pattern of the soft mold 174. Specifically, the conductive polymer 172 pattern covers the contact supporting part 152 on the TFT array 140 and is formed in a part which is in contact with the pixel electrode 122.

After solidifying the conductive polymer 172 pattern by use of a thermosetting process, a light curing process through a photo polymerization reaction process or a temperature-applying treatment, the soft mold 174 is separated from the TFT array 140. Then, the contact electrode 154 is formed of the conductive polymer 172, as shown in FIG. 6C.

Figure 7C:
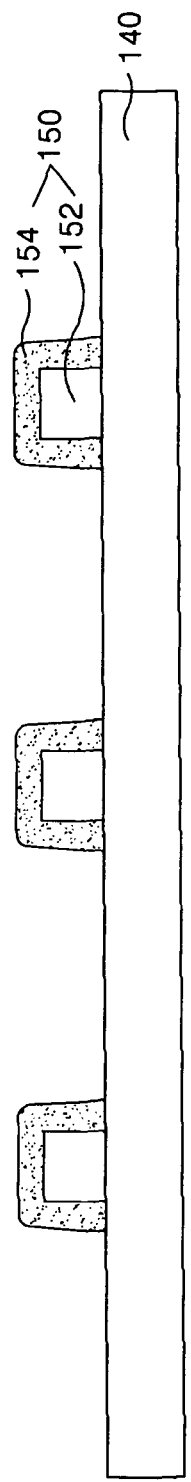

FIGS. 7A to 7C are diagrams illustrating a second embodiment of forming the contact electrode 154 on the contact supporting part 152.

At first, referring to FIG. 7A, the conductive polymer 172 is disposed by a supply roller 176 where the conductive polymer 172 is spread on the surface thereof on the contact supporting part 152 where the TFT array 140 is formed. The conductive polymer 172 used in the second embodiment comprises at least selected one of plyaniline, polypyrole, polythiopene, and so one in the same manner as the first embodiment. However, this embodiment uses a printing technique and solidifies the conductive polymer material of high viscosity within a short time after spreading the conductive polymer material. The conductive polymer material can be mixed with an organic solvent of an alcohol group which can be easily vaporized.

Heat is applied to the conductive polymer 172 disposed on the contact supporting part 152 at not less than a glass transition temperature of the conductive polymer which remains in a state where the solvent is removed (vaporized), as shown in FIG. 7B. Then, the conductive polymer 172 is softened by the heat so as to flow down completely covering the contact supporting part 152, thereby being in contact with the pixel electrode 122 of the TFT array 140. Accordingly, the contact electrode 154 of the conductive polymer 172 is formed, as shown in FIG. 7C.

The light emission area 130 and the TFT array 140 formed in this way are bonded by the sealant 160 spread between the first substrate 101 and the second substrate 102, as in FIG. 2, so as to be electrically connected through the contact part 150. At this moment, the contact electrode 154 of the contact part 150 formed on the pixel electrode 122 of the TFT array 140 is formed of the conductive polymer, thereby having a low surface energy. And, the second electrode 117 of the light emission array 130 is formed of a metal material, thereby having a high surface energy. Thus, the adhesive force is greatly improved than the related art where the contact electrode 154 and the second electrode 117 are all formed of the metal material. Further, the risk of the causing the contact defect is low even if there is a thickness difference between the contact parts 150 when being in contact with the second electrode 117 of the light emission array 130 due to the elastic characteristic of the conductive polymer. In addition, the contacting area is increased to improve the contact therebetween.

In addition, in the method of forming the contact electrode 154 in the related art, the mask process is used. Therefore, there is a problem in that the required time for process is long, the photo-resist material and stripping solution are wasted, and expensive equipments such as exposure equipment and so on are needed. However, no mask process is required in the illustrated embodiments of the present invention. Therefore, the fabrication process is simplified and the cost is reduced in comparison with the related art.

As described above, the organic electro-luminescence display device and the fabricating method thereof according to the illustrated embodiments of the present invention form the contact electrode by use of the conductive polymer material. Therefore, the contact surface can be perfectly in contact so as to generate no contact defect when the contact electrode is in contact with the second electrode of the light emission area by the pressure upon bonding them because the contact electrode which electrically connects the light emission array with the TFT array has ductility differently from the contact electrode of the related art that is formed of a metal. Accordingly, in the contact electrode according to the illustrated embodiments of the present invention, the wire breakage problem is reduced when being electrically in contact with the second electrode of the light emission array. Further, the organic electroluminescence display device and the fabricating method thereof form the contact electrode by use of the conductive polymer material differently from the related art where the contact electrode is formed of the metal by a photolithography process, thus the fabrication process is simplified and there is an effect of reducing the cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electroluminescence display device, comprising:
    a light emission array having a color filter array on a first substrate, a first and second electrodes formed on the color filter array and an organic light emitting layer formed between the first and second electrodes, wherein the organic light emitting layer includes a hole injecting/transporting layer, a light emitting layer and an electron injecting/transporting layer;
    a thin film transistor array having a pixel electrode connected to a thin film transistor on a second substrate for controlling the light emission array;
    a contact supporting part formed on the pixel electrode, wherein the contact supporting part is formed of a photo-resist; and
    a contact electrode formed of a conductive polymer material comprising any one of polypyrole and polythiopene to have elasticity, and positioned between the pixel electrode of the thin film transistor array and the second electrode of the light emission array to electrically connect the pixel electrode to the second electrodes formed of a metal material,
    wherein the contact electrode has a surface energy lower than the second electrode,
    wherein the second electrode of the light emission array is formed between the electron injecting/transporting layer and the contact electrode, and connected to the contact electrode having elasticity,
    wherein the thin film transistor array further comprises:
    a semiconductor layer formed on the second substrate, the semiconductor layer having a source area, a drain area and a channel area between the source area and the drain area;
    a gate electrode overlapped with the channel area of the semiconductor layer with a gate insulating film therebetween;
    a source electrode connected to the source area of the semiconductor layer through a source contact hole which penetrates the gate insulating film and an interlayer insulating film that is deposited on the gate insulating film; and
    a drain electrode connected to the drain area of the semiconductor layer through a drain contact hole which penetrates the gate insulating film and the interlayer insulating film,
    wherein the pixel electrode is connected to the drain electrode through a pixel contact hole which penetrates the interlayer insulating film and a passivation film that is deposited on the source electrode and the drain electrode,
    wherein the contact electrode and the contact supporting part are formed on a part of the pixel electrode, wherein the part of the pixel electrode is positioned on the passivation film, and
    wherein the contact electrode is formed to cover a top surface and side surfaces of the contact supporting part and connected to the second electrode.

2. The organic electroluminescence display device according to claim 1, wherein the light emission array further comprises:
    a barrier rib formed on the first electrode for dividing the organic light emitting layer and the second electrode to define a pixel area,
    wherein the first electrode is formed between the color filter array and the hole injecting/transporting layer.

3. The organic electroluminescence display device according to claim 2, wherein the color filter array further comprises:
    a black matrix formed at a location corresponding to the barrier rib on the first substrate;
    a plurality of color filters formed with the black matrix therebetween;
    an auxiliary color layer formed on the color filter; and
    an overcoat layer formed on the first substrate where the auxiliary color layer is formed.

4. The organic electroluminescence display device according to claim 1, wherein the first and second substrates are bonded together by a sealant.

* * * * *